(12) United States Patent
Lunde et al.

(10) Patent No.: US 7,208,758 B2
(45) Date of Patent: Apr. 24, 2007

(54) DYNAMIC INTEGRATED CIRCUIT CLUSTERS, MODULES INCLUDING SAME AND METHODS OF FABRICATING

(75) Inventors: Aron T. Lunde, Boise, ID (US); Kevin G. Duesman, Boise, ID (US); Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 10/663,898

(22) Filed: Sep. 16, 2003

(65) Prior Publication Data

US 2005/0056945 A1    Mar. 17, 2005

(51) Int. Cl.
*H01L 23/58* (2006.01)
(52) U.S. Cl. .......................... 257/48; 257/723; 257/778
(58) Field of Classification Search .................. 257/48, 257/773, 737, 738, 690, 778, 723, 724, 685
See application file for complete search history.

(56) References Cited

U.S. PATENT DOCUMENTS

| | | | |
|---|---|---|---|
| 4,703,436 A | 10/1987 | Varshney | |
| 5,214,657 A | 5/1993 | Farnworth et al. | |
| 5,581,205 A | 12/1996 | Sugibayashi | |
| 5,832,601 A | 11/1998 | Eldridge et al. | |
| 5,963,289 A | 10/1999 | Stefanov et al. | |
| 6,255,726 B1 | 7/2001 | Vindasius et al. | |
| 6,262,587 B1 | 7/2001 | Whetsel | |
| 6,486,005 B1* | 11/2002 | Kim | 438/118 |
| 6,627,917 B1* | 9/2003 | Fenner et al. | 257/48 |
| 6,744,067 B1* | 6/2004 | Farnworth et al. | 257/48 |
| 6,844,218 B2 | 1/2005 | Potts | |
| 2004/0043533 A1* | 3/2004 | Chua et al. | 438/106 |

\* cited by examiner

*Primary Examiner*—Hoai Pham
*Assistant Examiner*—DiLinh Nguyen
(74) *Attorney, Agent, or Firm*—TraskBritt, PC

(57) ABSTRACT

A semiconductor wafer or other bulk semiconductor substrate having a plurality of dice thereon is manufactured using conventional processing techniques. The wafer is subjected to testing to identify functional and nonfunctional dice. The locations of the functional dice are analyzed to determine the location of immediately adjacent or closely proximate functional dice. A group of functional dice is identified and an interconnection circuit is formed therebetween. The functional die group, once interconnected, is then segmented from the wafer while maintaining the unitary integrity of the functional die group as well as the associated interconnections between dice. Modules including one or more functional die groups and methods of fabricating functional die groups and modules are also disclosed.

17 Claims, 9 Drawing Sheets

DYNAMIC INTEGRATED CIRCUIT CLUSTERS, MODULES INCLUDING SAME AND METHODS OF FABRICATING

BACKGROUND OF THE INVENTION

1. Field of the Invention

The present invention relates to a semiconductor device and, more particularly, to a semiconductor device formed from adjacent dice on a semiconductor wafer.

2. State of the Art

Electrical components and circuits have been manufactured for some time in the form of integrated circuits fabricated on wafers of semiconductor materials. Formation of integrated circuits on a semiconductor wafer utilizes various techniques such as etching, doping, and layering for forming active circuits and interconnects. Individual integrated circuits on a wafer are referred to as dice and provide an interface for coupling with external electrical connections. Generally, a die on a wafer is separated from other dice by cutting the wafer along scribe or segmentation lanes thereby forming individual integrated circuit "chips" that may be subsequently packaged for use. Because of the increased integration and miniaturization of electronic systems, a need has arisen for identifying higher density approaches for packaging integrated circuits.

One approach for improving packaging density of integrated circuits has been to place chips on a circuit board in a vertically stacked arrangement. In such approaches, chips are generally packaged and then the individual packages are stacked in a vertical arrangement. Vertical package approaches have utilized an intricate and sophisticated cross-wiring approach which modifies the individual chips so that they may be stacked by adding a pattern of metallization, often called rerouting leads, to the surface of the wafer. Such rerouting leads extend from the bond pads of the chip to newly formed bond pads that may be arranged along the terminating edge of the chip. In such a configuration, each modified chip is then cut from the wafer and assembled into a stack such that all of the leads of the modified chips are aligned along the same side of the stack resulting in a vertical interconnection of the individual chips. Such approaches result in only modest volumetric improvements at a great interconnection expense that presents many opportunities for failure as well as requires intricate assembly approaches.

Other approaches for arraying or otherwise assembling multiple integrated circuits in a more volume-efficient approach include the formation of memory modules which are formed from individual dice that are assembled individually on a common printed circuit board with each of the pads from an individual die routed to the external printed circuit board which provides the interconnection to an adjacent die or dice. While such an approach reduces the number of packages per die, as a plurality of dice are placed on a single printed circuit board and then packaged into a larger memory module assembly, such an approach still results in significant spacing between each of the individual dice in order to accommodate manufacturing processes for externally coupling die pads from one integrated circuit to adjacent integrated circuits. Therefore, there is a nee for providing an improved and volumetrically more efficient coupling of integrated circuit chips without incurring significant expense of assembling and interconnecting multiple dice for use in higher assembly package.

BRIEF SUMMARY OF THE INVENTION

A semiconductor wafer having a plurality of dice thereon is manufactured using conventional processing techniques. The wafer is subjected to probe testing or other testing to identify functional and nonfunctional dice. The locations of the functional dice are analyzed to determine the presence of clusters of functional dice or at least the location of adjacent functional dice. A group of functional dice is identified and an interconnection circuit is formed for routing together the signals of adjacent dice at the wafer-level to minimize external interconnections once the dice are segmented into devices. The functional dice group, once interconnected, is then segmented from the wafer while maintaining the unitary structural integrity of the functional die group as well as the associated interconnections between dice. Wafer-level interconnection of functional dice reduces volumetric requirements on the next higher assembly as well as reduces interconnection labor and dimensions by maintaining die-to-die interconnection at the semiconductor wafer-level.

The present invention includes several approaches for forming the interconnection circuit including the identification of functional dice and the formation of the circuit specifically between the functional dice as well as an approach to form an interconnection circuit over entire portions of the semiconductor wafer with the nongrouped portions becoming electrically isolated when individual groups of dice become segmented. The interconnection circuit, in one embodiment, is formed using redistribution layer techniques for forming electrical contacts with bond pads of individual dice. The interconnection circuit includes conductive segments that are routed between respective bond pads of adjacent or nearly adjacent dice. Another embodiment of the present invention teaches coupling functional dice together that are separated from each other by one or more nonfunctional dice. In such an embodiment, the interconnection circuit may also couple to the bond pad of a nonfunctional dice which provides the bridging of electrical conductive segments between functional dice. Techniques are also disclosed for isolating the circuitry of the nonfunctional die to prevent undesirable capacitance or loading of the desired signal. A memory module as well as an electronic system interconnected with functional die groups is also encompassed by the present invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The term "semiconductor wafer" as used herein means and includes a bulk substrate comprised of any of various semiconductive materials including, but not limited to, silicon, silicon-on-sapphire (SOS), silicon-on-insulator (SOI), silicon-on-glass (SOG), galium arsenide, iridium phosphide, etc.

Figure 1:
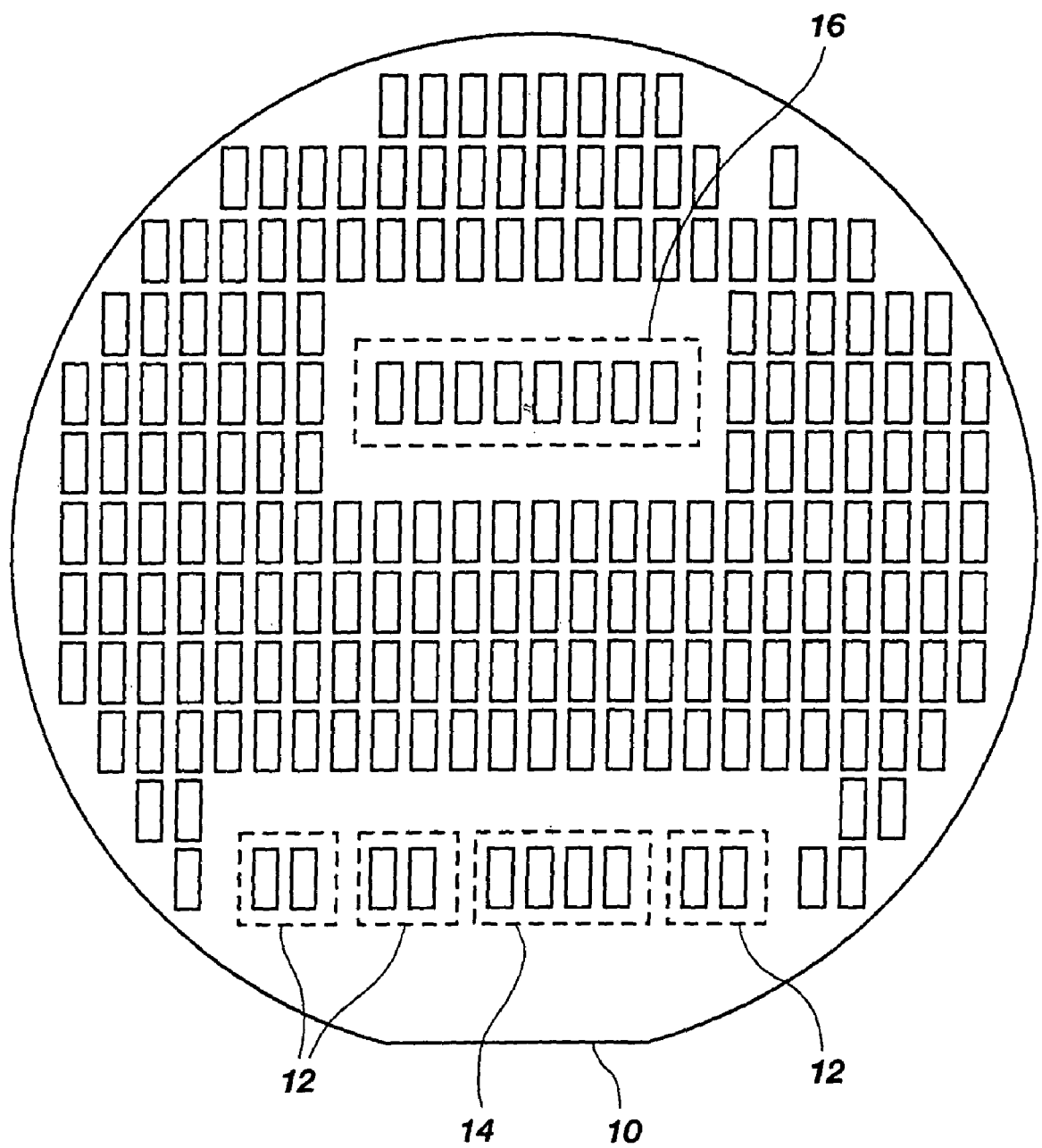
FIG. 1 is a plan view of a processed semiconductor wafer comprising a plurality of dice with functional dice groups illustrated thereon, in accordance with the present invention.

When integrated circuits are formed on a semiconductor wafer, a matrix of functional and nonfunctional dice are produced. Accordingly, a random physical distribution of functional and nonfunctional circuits may be produced as shown for wafer 10 in FIG. 1. Note that some dice locations surrounding groups of functional dice have been omitted for clarity. An embodiment of the present invention provides a system for coupling multiple dice at the wafer level and maintaining such wafer-level coupling at the packaged device level to produce dynamic memory clusters of varying multiple-dice configurations. FIG. 1 displays functional and nonfunctional dice in a matrix. The matrix size discussed herein is for purposes of example only and should not be construed as limiting the invention to any particular matrix size. The present invention may be provided using any number of matrix sizes and may be a uniformly similar functional type of integrated circuit or may be a mixture of different functional types of integrated circuits.

FIG. 1 illustrates test results of the probing or probe testing of wafer 10 wherein functional and nonfunctional dice are identified. Those of ordinary skill in the art appreciate the processes associated with probing a wafer to identify functional and nonfunctional components. In some probing applications, individual dice are singularly probed while in other probing applications a plurality of dice may be simultaneously probed in order to determine their operational capabilities. While each individual dice is probed, a mapping of functional dice is maintained in order to minimize and preferably eliminate any subsequent manufacturing or testing processes on nonfunctional dice.

While traditional probe tests record the location and functionality of each dice, the present invention also evaluates the functionality of adjacent dice and is concerned with the grouping of dice or possible grouping of dice for the potential creation of memory clusters or groups of adjacent or proximately adjacent functional dice. Several groupings of adjacently located functional dice are illustrated in FIG. 1 with grouping of two functional dice illustrated generally as functional dice groups 12. While the abundance of functional dice groupings is largely a function of processing yield, it should be appreciated that the clustering or grouping may vary among product and processing variations and the configurations presented are merely illustrative.

Similarly, groupings of four functional dice are exemplarily illustrated as functional dice group 14 with a grouping of eight functional dice illustrated generally as functional dice group 16. While horizontally adjacently grouped functional dice are illustrated, the present invention further contemplates other adjacently oriented groupings, including irregularly configured groupings of functional dice, are also within the scope of the present invention.

Figure 2:
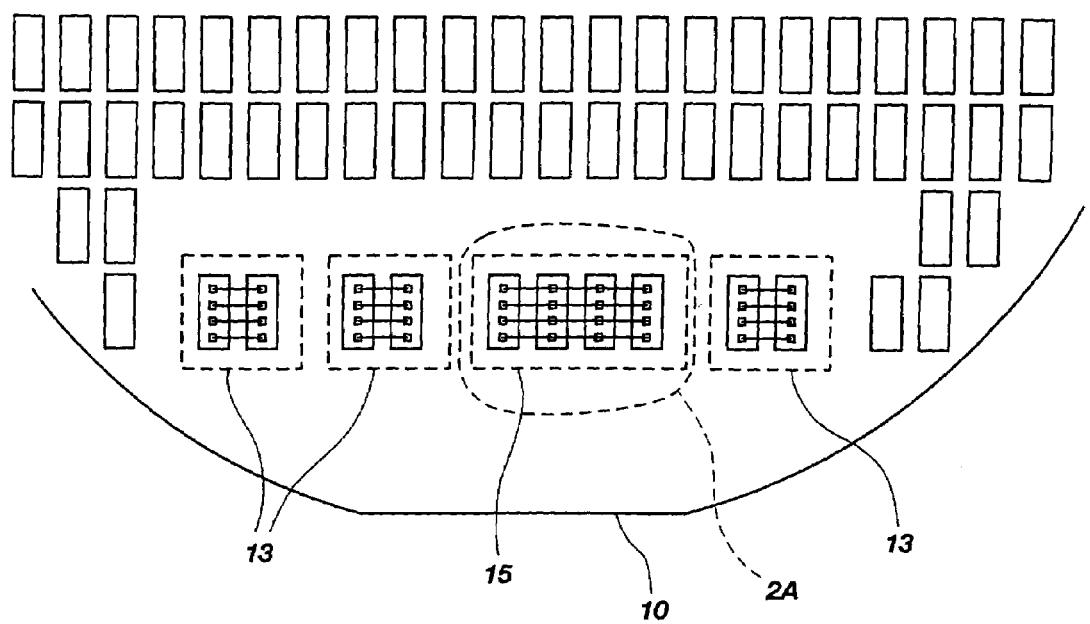
FIG. 2 is a detailed illustration of a semiconductor wafer having identified groups of functional dice thereon, in accordance with an embodiment of the present invention.
Figure 2A:
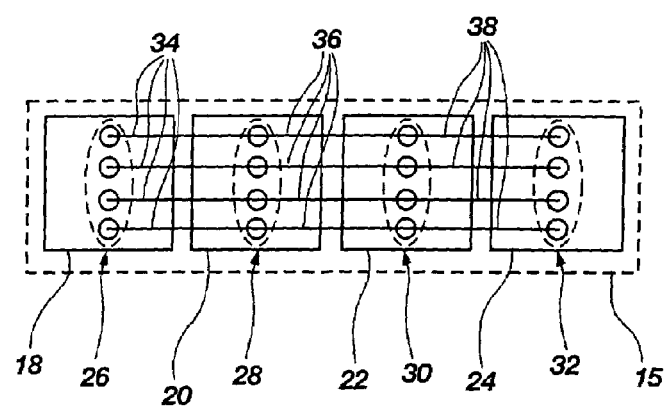
FIG. 2A is a detailed view of one of the functional die groups and an associated interconnection circuit, in accordance with an embodiment of the present invention.

FIG. 2 illustrates a detailed view of semiconductor devices, namely interconnected functional dice groups 13 and 15, the individual dice of each of which are operably coupled with an adjacent dice interconnection circuit in accordance with an embodiment of the present invention. FIG. 2A illustrates a detail of interconnected functional dice group 15 comprised of functional dice 18–24 which are illustrated as being arranged in a horizontally adjacent configuration. From previous probe testing, functional dice 18–24 were identified as being operational and further identified as being adjacently interconnectable, in accordance with an embodiment of the present invention. FIG. 2A illustrates an exemplary pinout configuration for each of functional dice 18–24 illustrated as being linearly configured arrays of bond pads 26–32. By way of example, and not limitation, arrays of bond pads 26–32 are illustrated as being comprised of a plurality of bond pads, for clarity's sake being illustrated as each only including four bond pads. Those of ordinary skill in the art appreciate that integrated circuits generally comprise an appreciable number of bond pads, and in the case of memory devices, include bond pads corresponding to address signals as well as other control signals including power, ground, and reference signals for individually accessing data storage elements. Interconnected functional dice group 15 is further comprised of adjacent dice interconnection segments 34–38 which are respectively formed between selected bond pads of arrays 26–32 to form a parallel interconnection scheme. Adjacent dice interconnection segments 34–38 are preferably formed as patterned conductors through the use of a subsequent wafer level processing technique.

Figure 2B:
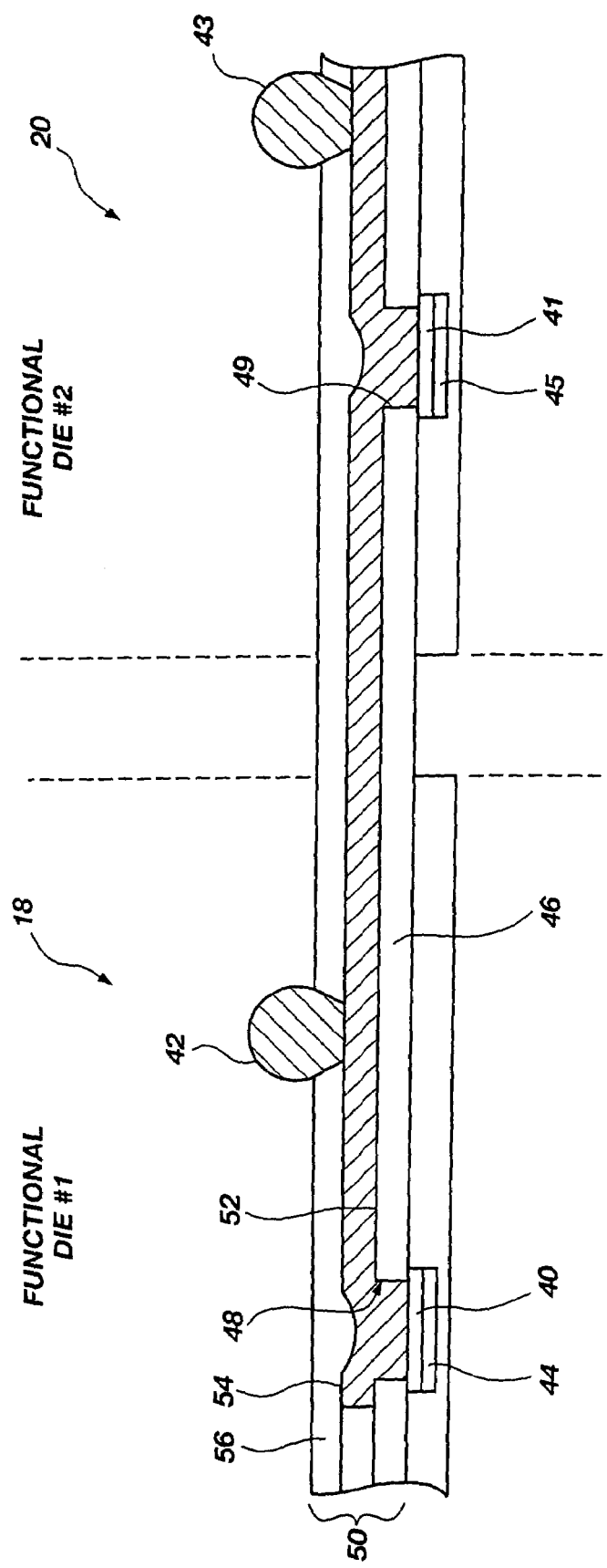
FIG. 2B is a cross-sectional view of an adjacent dice interconnection circuit, in accordance with an embodiment of the present invention.

The adjacent dice interconnection segments maybe formed as part of a wafer post processing step such as through the use of a redistribution layer process wherein conductive traces formed by deposition and patterning are formed in contact with bond pads and routed away from the bond pads. FIG. 2B illustrates one such process wherein functional dice 18, 20 include bond pads 40, 41 respectively in electrical communication with a contact used for connection to an external device such as conductive bumps 42, 43, each of which may comprise a solder bump or conductive or conductive-filled epoxy bump configured as a ball, column, pillar, or stud. In addition, functional dice 18, 20 include internal conductors 44, 45 in electrical communication with bond pads 40, 41, and the various integrated circuits (not shown) formed on the active surface of functional dice 18, 20. Functional dice 18, 20 also include a passivation layer 46 formed on functional dice 18, 20 with openings 48, 49 through the passivation layer 46 exposing the bond pads 40, 41.

Adjacent die interconnection circuit 50 is formed on a surface 52 of the passivation layer 46 and may be used to interconnect any external connection such as conductive bumps 42, 43 with the bond pads 40, 41. The adjacent die interconnection circuit 50 includes conductor segment 54 in electrical communication with bond pad 40 and extending away therefrom to bond pad 41 of functional die 20, and an outer passivation layer 56 which covers the conductor segment 54. The outer passivation layer 56 of the adjacent die interconnection circuit 50 insulates the conductor segment 54, and apertures may be formed therethrough to locate and facilitate the formation of conductive bumps 42, 43. Both passivation layer 46 and outer passivation layer 56 may comprise a dicelectric material, with suitable materials for outer passivation layer 56 including polymers such as polyimide, glasses such as PSG, BSG or BPSG, or oxides, such as $SiO_2$.

The present invention contemplates the coupling of several functional dice together with the respective bond pads of each functional dice operably coupled together through an adjacent die interconnection circuit. Therefore, an adjacent die interconnection circuit that operably couples multiple dice includes a corresponding number of conductor segments that electrically link between a bond pad of one die to the bond pad of the adjacent dice, etc. Therefore, by way of example, a semiconductor device comprised of three adjacent functional dice would include an adjacent die interconnection circuit that is comprised of a first conductor segment for linking the first and second dice together and then a second conductor segment for linking the second and third dice together.

The adjacent die interconnection circuit 50 may be fabricated using photolithographic patterning of a deposited metal layer through the use of a single reticle for each type of functional dice group (e.g., two dice, three dice, four dice, etc.) which, in the present embodiment may be aligned with each functional die group for the formation of the adjacent die interconnection circuit 50. Such a reticle pattern may accommodate the formation of conductor segments and, additionally, may facilitate the formation of bumped contacts on one or more of the adjacent functional dice to form an interconnection pattern as illustrated in FIG. 2. The interconnection pattern illustrated in FIG. 2 couples together functional dice that have an adjacently functional counterpart for the formation of a functional die group.

Figure 3:
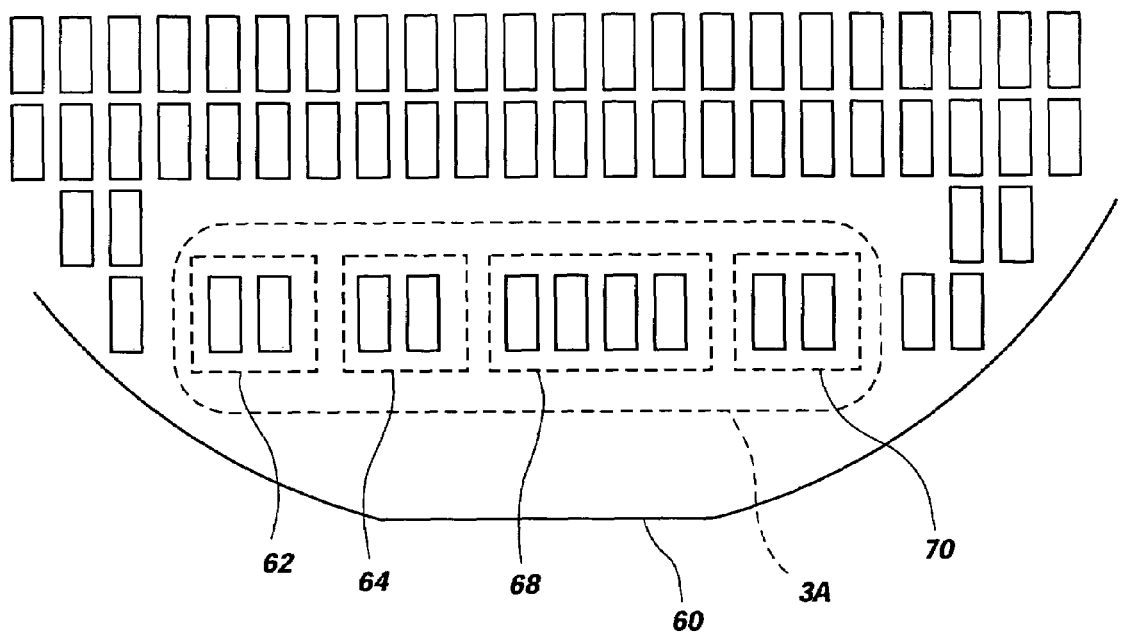
FIG. 3 is a detailed view of a semiconductor wafer having groupings of functional dice identified thereon.

FIG. 3 illustrates an alternative embodiment for the coupling of functional dice. In similar manner with the previous embodiment, the individual dice on wafer 60 undergo probe testing for the identification of functional and nonfunctional dice. The test results of the probe testing process are obtained and analyzed to identify adjacent functional dice for the formation of functional die groups. The identification of functional die groups, such as functional die groups 62, 64, 68, 70, identifies functional dice candidates for forming into semiconductor devices, namely interconnected functional die groups. In the present embodiment, however, rather than coupling together only those functional dice which are aggregated into a functional die group, some nonfunctional dice are also included within the formation of adjacent die interconnection circuits.

Figure 3A:
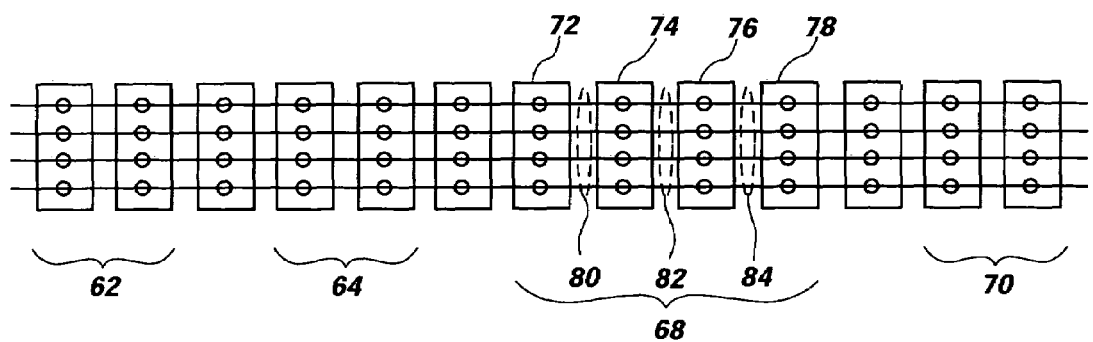
FIG. 3A is a detailed view of an adjacent die interconnection circuit for coupling adjacent functional dice within a group, in accordance with another embodiment of the present invention.

FIG. 3A illustrates the coupling of functional dice 72–78 through the formation of adjacent die interconnection segments 80–84 for the coupling of their respective bond pads. Similarly, functional die groups 64 and 70 are also routed to adjacent functional dice for the formation of the respective semiconductor devices, namely interconnected functional die groups. However, the present embodiment also contemplates formation of the adjacent die interconnection circuits between adjacent functional dice by coupling at least some nonfunctional dice together with adjacent functional dice before segmentation. Such a process may be performed on a portion of the wafer or adjacent die interconnection circuits may be formed throughout an entire die with the coupling of functional dice to nonfunctional die being severed during the segmentation process wherein functional and nonfunctional die are diced or segmented.

Figure 4:
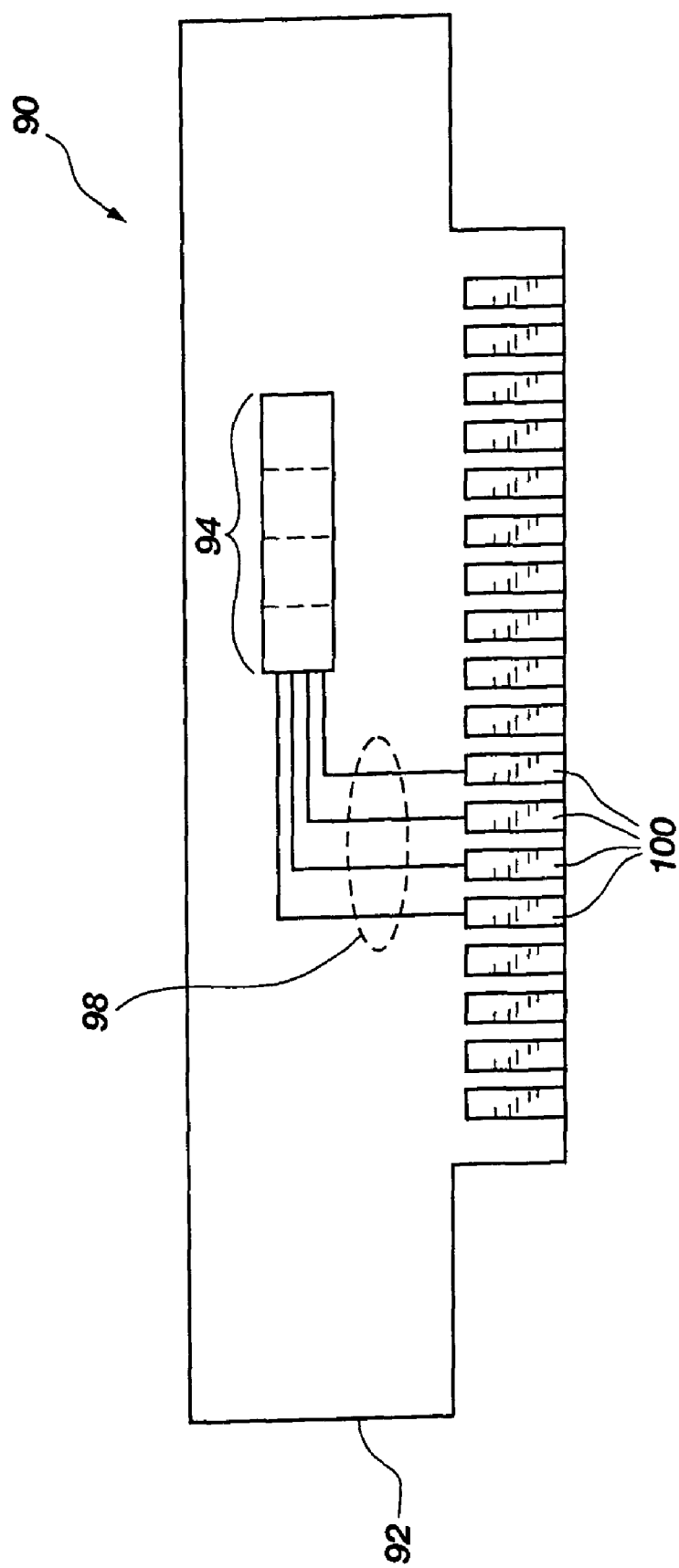
FIG. 4 is a view of a memory module for coupling thereon an integral plurality of functional dice interconnected according to an embodiment of the present invention.
Figure 4B:
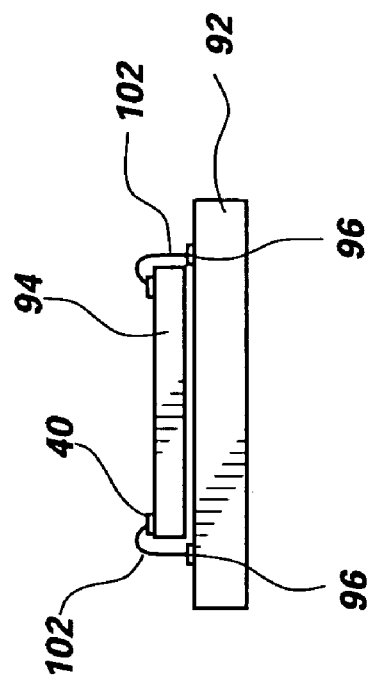
FIG. 4B is a cross-sectional view of a functional dice group associated with a substrate of a memory module, in accordance with another embodiment of the present invention.
Figure 4A:
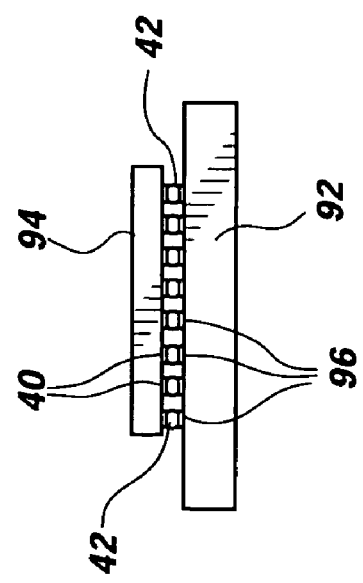
FIG. 4A is a cross-sectional view of a functional dice group mounted to a substrate of a memory module, in accordance with an embodiment of the present invention.

Referring to FIG. 4, a memory module 90 in accordance with the present invention is illustrated as having an elongate carrier substrate 92, such as a printed circuit board (PCB) or other substrate known in the art to which a plurality of functional dice are attached. The plurality of functional dice are integral in form and are not individually segmented as in the case of prior art applications but comprise a single contiguous semiconductor substrate and are interconnected with one another according to the formation of the adjacent die interconnection circuits previously described. Coupling of the semiconductor device, illustrated as interconnected functional die group 94, with substrate 92, in one embodiment, may be accomplished through the use of flip-chip bonding wherein the plurality of functional chips are provided with conductive bumps, shown as conductive bumps 42 in FIG. 4A, with each conductive bump 42 electrically coupled to a functionally-like bond pad of each functional die within the interconnected functional die group 94. Interconnected functional die group 94 is operably coupled with substrate 92 by superimposing the conductive bumps 42 over similarly configured substrate contacts or terminal pads 96 on the surface of substrate 92, at which time the conductive bumps 42 (if solder) are heated and melted or "reflowed" to form mechanical and electrical connections between the substrate 92 and functional die group 94. Alternatively, the functional die group 94 may be wire bonded by wire bonds 102 to the substrate 92, as illustrated in FIG. 4B, by wire bonding from adjacent die interconnection segments (e.g., segments 34–38 (FIG. 2A) and segments 80–84 (FIG. 3A)) to substrate contacts 96 which further couple via conductors 98 to PCB electrical contacts 100. The use of TAB connections comprising conductive traces on flexible dicelectrics, as well as the use of edge connects in a vertical surface mount configuration, are also contemplated.

In accordance with a further embodiment, the die group 94 of FIG. 4 may be interconnected one with another, either partially or in totality through conductor 98 on substrate 92. In the present embodiment, the conductors 98 may provide electrical coupling between each of the, for example, conductive bumps 42 (FIG. 4A) rather than rely upon conductive traces formed on the die group 94.

Figure 5:
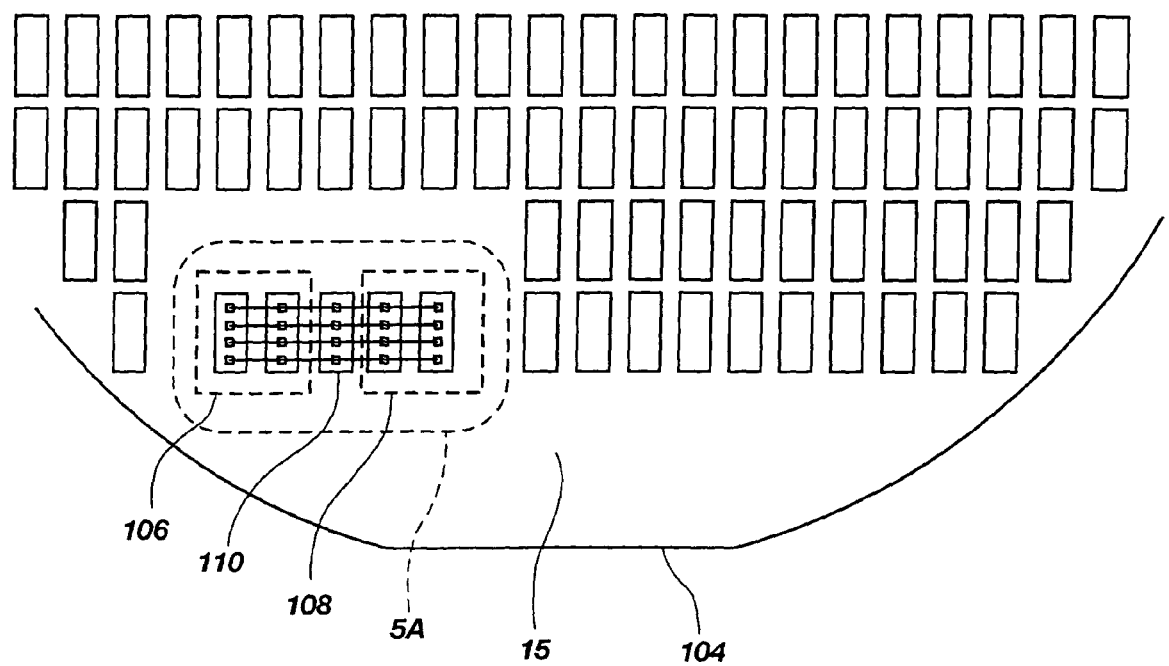
FIG. 5 is a view of a semiconductor wafer having identified groupings of functional dice for interconnecting in accordance with an embodiment of the present invention.
Figure 5A:
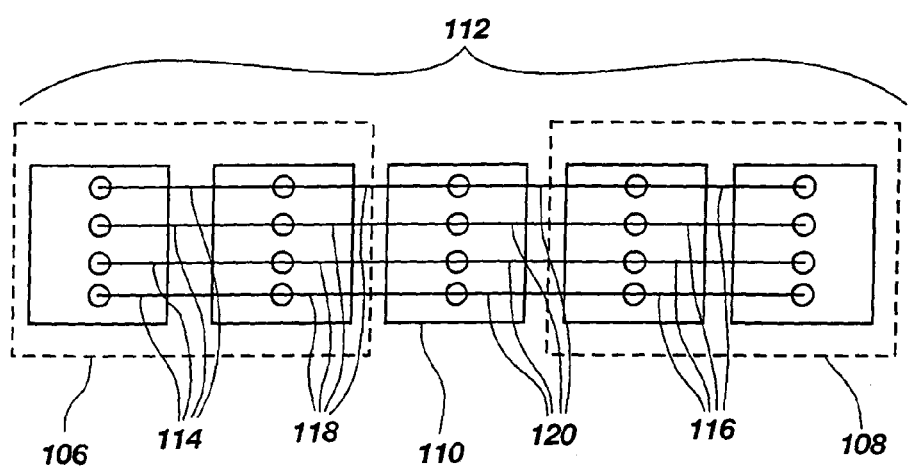
FIG. 5A is a detailed view of an adjacent dice interconnection circuit for coupling nearly adjacent groups of functional dice, in accordance with an embodiment of the present invention.

FIGS. 5 and 5A illustrate another embodiment for coupling together relatively adjacent groups of functional dice. In FIG. 5, a wafer 104 is illustrated as having two relatively adjacently located functional die groups 106 and 108 which are separated by a nonfunctional die 110. The present invention contemplates the coupling of relatively adjacent functional die groups, such as functional die groups 106 and 108 into a single semiconductor device, illustrated as interconnected functional die group 112.

FIG. 5A illustrates the coupling of functional die groups 106 and 108 via bridging nonfunctional die 110 through the use of an adjacent die interconnection circuit 50 described previously. In the present embodiment, the adjacent die interconnection segments 114 couple the functional dice of functional dice group 106 and adjacent die interconnection segments 116 couple the functional dice within functional die group 108. Additionally, the present embodiment further utilizes adjacent die interconnection segments 118 and 120 for bridging an electrical interconnect across the nonfunctional dice 110. Following the coupling together of functional die groups 106 and 108, the entire five-dice assembly may then be unitarily segmented from the wafer as a semiconductor device, illustrated as interconnected functional dice group 112.

Figure 6:
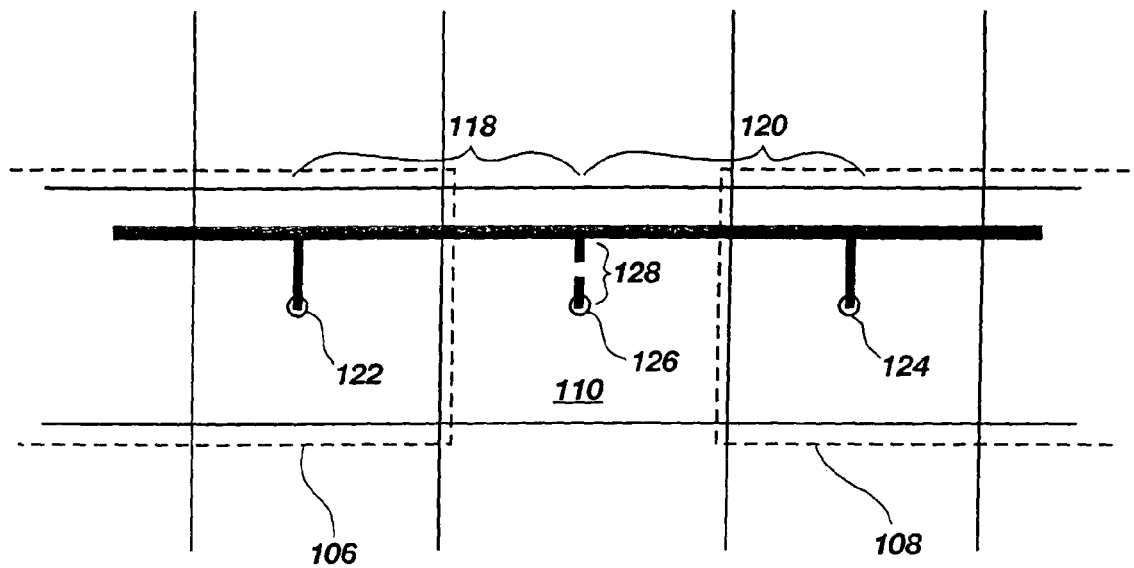
FIG. 6 is a detailed view of an adjacent dice interconnection circuit spanning a nonfunctional dice, in accordance with an embodiment of the present invention.
Figure 7:
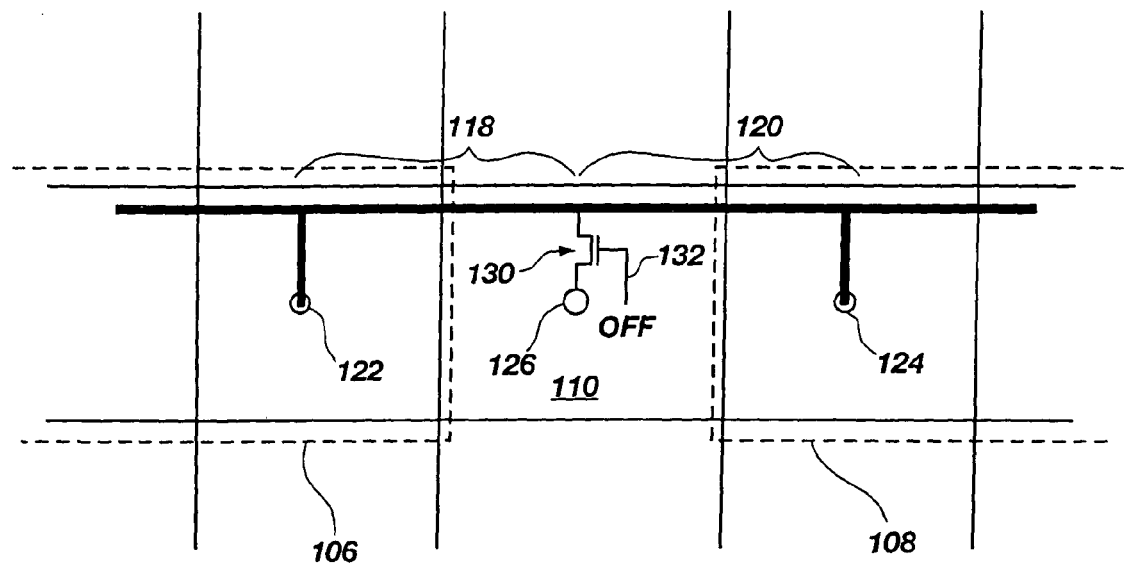
FIG. 7 is a detailed view of an adjacent dice interconnection circuit spanning a nonfunctional dice, in accordance with an embodiment of the present invention.

FIGS. 6 and 7 contemplate the deleterious effects associated with having a nonfunctional die within a larger assembly, namely the undesirable aberrational behavior or at least the undesirable additional capacitance associated with unnecessary circuitry attached to adjacent die interconnection segments. In FIG. 6, adjacent die interconnection segments 118 and 120 bridge the coupling of functional die groups 106 and 108 through the coupling of the respective bond pads 122 and 124. However, bond pad 126 of nonfunctional die 110 is isolated through the process of open circuiting a nonfunctional die bond pad isolation conductive segment 128 through a manufacturing process such as laser ablation or through the use of an etching process through foregoing an interconnection processing step that generates an interconnect between bond pad 126 and conductive segment 128. Alternatively, FIG. 7 depicts the isolation of bond pad 126 from adjacent die interconnection segments 118 and 120 through the use of a gating or isolation device 130 which may be further controlled by an isolation control signal 132. Other forms of isolating bond pad 126 and the associated capacitance and deleterious effects associated therewith are also contemplated as within the scope of the present invention.

Figure 8:
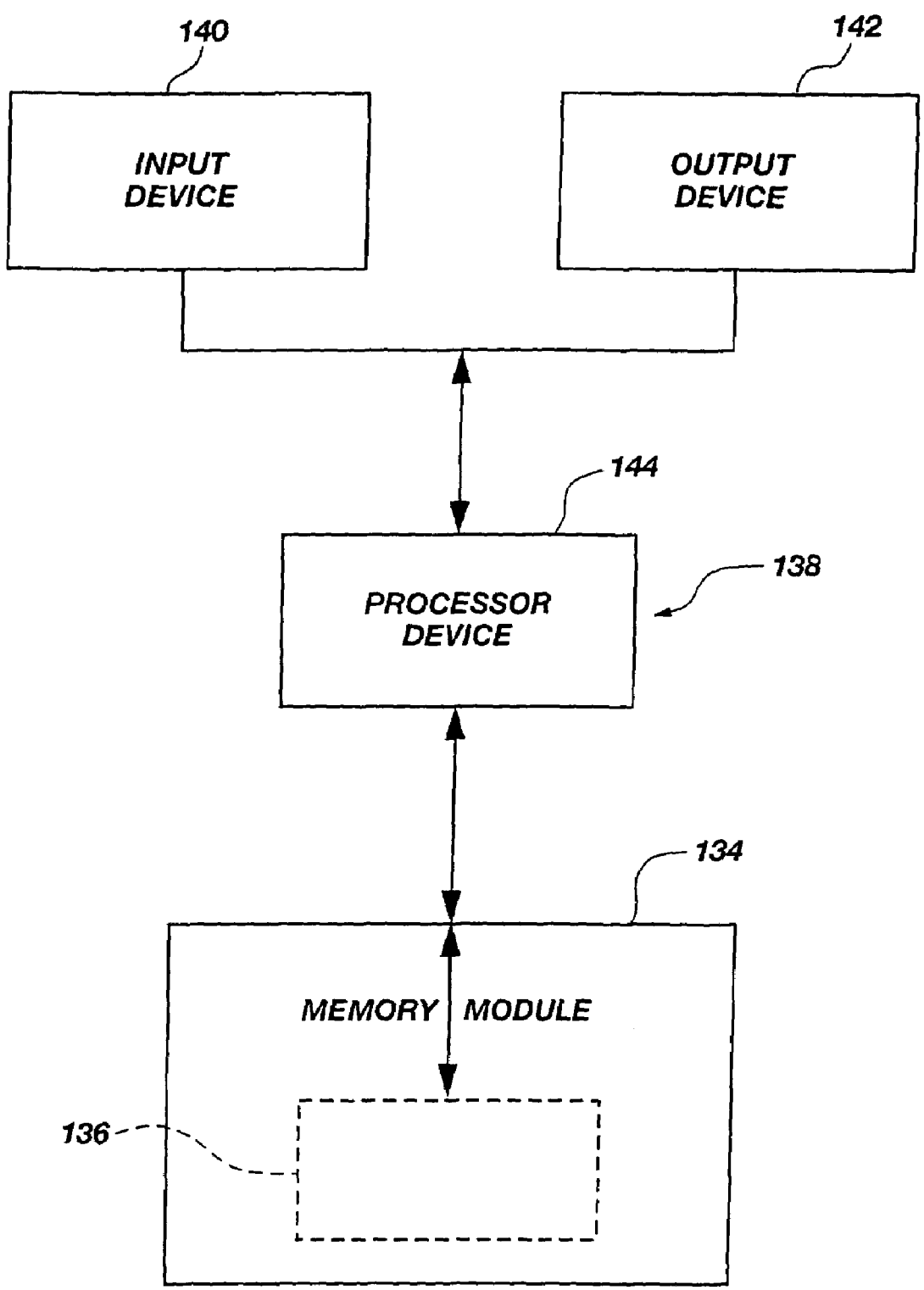
FIG. 8 is a diagrammatical view of an electronic system including a memory module configured in accordance with an embodiment of the present invention.

It is also contemplated that various other modules, including memory modules such as a memory module 134 illustrated in FIG. 8 which includes a semiconductor device, namely interconnected functional dice group 136, may be incorporated into an electronic system 138, such as a computer system, that includes an input device 140 and an output device 142 coupled to a processor device 144. Of course, the interconnected functional dice group 136 may also be incorporated into the input device 140, the output device 142, or the processor device 144.

The present interconnection approach addresses concerns for accurately routing interconnections to avoid or at least characterize and minimize signal crosstalk. Additionally, module sizes may be minimized by interconnection of various like signals at a device level rather than at a module level. Furthermore, interconnecting bussed signals such as ADDR, RAS, CAS, WE, CLK, CKE greatly reduces interconnections, impedances and their susceptibility to crosstalk and other interference. Signals such as VCC, GND, CS and the DQs preferably are not connected in parallel. The grouped and interconnected parts may then be sawed from the wafer as an individual unit and applied in a system where space sensitivity and routing complexity are appreciated.

It will be appreciated by those skilled in the art that various circuits and methods can be used to achieve the desired memory capability of the memory module, through the incorporation of a varying number of functional dice which may be coupled to one another through the adjacent die interconnection circuit described herein, or may alternatively be coupled to other functional dice via adjacent nonfunctional die or die. Those of ordinary skill in the art also appreciate that the number and configuration of the die, as well as the geometric relationship with other neighboring devices, whether functional or nonfunctional, are also contemplated and the immediate adjacent nature of the functional and nonfunctional die as illustrated herein are but one example of relationships of a die with other dice on an integral wafer. Additionally, the bonding techniques for attaching and electrically interconnecting the semiconductor device (e.g., interconnected functional die group) with the substrate according to the methods described herein, are also but an example that is not to be considered limiting.

It will also be appreciated by one of ordinary skill in the art that one or more features of any of the illustrated embodiments may be combined with one or more features from another to form yet another combination within the scope of the invention as described and claimed herein. Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A semiconductor device, comprising:
    a first functional die including at least a first bond pad;
    at least a second functional die including at least a second bond pad, the at least a second functional die formed and maintained as a unitary integral wafer segment with the first functional die;
    an adjacent die interconnection circuit operably coupling the at least a first bond pad of the first functional die with the at least a second bond pad of the at least a second functional die, wherein the adjacent die interconnection circuit includes at least one conductor segment having a first end electrically coupled to the at least a first bond pad and a second end electrically coupled to the at least a second bond pad;
    at least one nonfunctional die including at least one bond pad, the at least one nonfunctional die being formed on the unitary integral wafer segment and located thereon adjacent to one of the first functional die and the at least a second functional die; and
    wherein the at least one conductor segment extends between the at least a first bond pad and the at least one bond pad of the at least one nonfunctional die, the adjacent die interconnection circuit further including a second conductive segment extending between the at least one bond pad of the at least one nonfunctional die and the at least a second bond pad.

2. The semiconductor device, as recited in claim 1, wherein the adjacent die interconnection circuit further includes a conductive bump electrically coupled to the at least one conductor segment configured for operatively coupling the at least one conductor segment of the semiconductor device with a substrate contact of a higher level packaging element.

3. The semiconductor device, as recited in claim 1, wherein the first functional die and the at least a second functional die are immediately adjacent.

4. The semiconductor device, as recited in claim 1, wherein the first functional die and the at least a second functional die are separated by at least one nonfunctional die.

5. The semiconductor device, as recited in claim 1, further comprising a nonfunctional die bond pad isolation conductive segment including a first end electrically attached to the at least one conductor segment and the second conductive segment for coupling the at least a first bond pad of the first functional die with the at least a second bond pad of the at least a second functional die, the nonfunctional die bond pad isolation conductive segment further including a second end extending to the at least one nonfunctional die bond pad, the nonfunctional die bond pad isolation conductive segment being fabricated as an open circuit.

6. The semiconductor device, as recited in claim 1, wherein the at least one nonfunctional die further includes an isolation device coupled to the at least one bond pad of the at least one nonfunctional die for electrically isolating the at least one nonfunctional die from the adjacent die interconnection circuit.

7. A segment of a semiconductor wafer, comprising:
two or more functional dice each including at least one bond pad, the two or more functional dice formed and maintained as a unitary integral wafer segment;
an adjacent die interconnection circuit for mutually operably coupling each at least one bond pad of the two or more functional dice to at least one other bond pad of the two or more functional dice;
at least one nonfunctional die including at least one bond pad, the nonfunctional die being formed on the unitary integral wafer segment and located thereon with the two or more functional dice; and
wherein the adjacent die interconnection circuit extends between the at least one bond pad of the at least one nonfunctional die to the at least one bond pad of the two or more functional dice.

8. The segment of a semiconductor wafer, as recited in claim 7, wherein the adjacent die interconnection circuit couples the two or more functional dice identified by testing of the semiconductor wafer to determine an operational status of each die on the semiconductor wafer.

9. The segment of semiconductor wafer, as recited in claim 7, wherein the adjacent die interconnection circuit includes a conductor segment for coupling between each of the two or more functional dice, the conductor segment including a first end electrically coupled to the at least one bond pad on one of the two or more functional dice and a second end electrically coupled to the at least one bond pad on another of the two or more functional dice.

10. The segment of semiconductor wafer, as recited in claim 7, wherein the two or more functional dice are immediately adjacent on the segment of semiconductor wafer.

11. The segment of semiconductor wafer, as recited in claim 7, wherein the two or more functional dice are separated by at least one nonfunctional die on the segment of semiconductor wafer.

12. A semiconductor wafer, comprising:
a plurality of dice each including a bond pad, the plurality of dice segregated according to functional dice and nonfunctional dice;
an adjacent die interconnection circuit operably coupling a first bond pad of a first functional die with a second bond pad of a second functional die, the first functional die and the second functional die formed and maintained as a unitary integral independently functional segment of the semiconductor wafer, wherein the adjacent die interconnection circuit includes at least one conductor segment having a first end electrically coupled to the first bond pad and a second end electrically coupled to the second bond pad for electrically coupling the first bond pad with the second bond pad;
at least one nonfunctional die including at least one bond pad, the nonfunctional die being formed on the unitary integral wafer segment and located thereon adjacent to one of the first functional die and the second functional die; and
wherein the at least one conductor segment extends between the first bond pad and the at least one bond pad of the at least one nonfunctional die, the adjacent die interconnection circuit further including a second conductive segment extending between the at least one bond pad of the at least one nonfunctional die and the second bond pad.

13. The semiconductor wafer, as recited in claim 12, wherein the first functional die and the second functional die are immediately adjacent on the semiconductor wafer.

14. The semiconductor wafer, as recited in claim 12, wherein the first functional die and the second functional die are separated by at least one nonfunctional die on the semiconductor wafer.

15. The semiconductor wafer, as recited in claim 12, wherein the adjacent die interconnection circuit further includes a conductive bump electrically coupled to the at least one conductor segment configured for operatively coupling the at least one conductor segment of the semiconductor wafer with a contact of a higher level packaging.

16. The semiconductor wafer, as recited in claim 12, further comprising a nonfunctional die bond pad isolation conductive segment including a first end electrically attached to the at least one conductor segment and the second conductive segment for coupling the first bond pad of the first functional die with the second bond pad of the second functional die, the nonfunctional die bond pad isolation conductive segment further including a second end extending to the at least one bond pad of the nonfunctional die, the nonfunctional die bond pad isolation conductive segment being fabricated as an open circuit.

17. The semiconductor wafer, as recited in claim 12, wherein the at least one nonfunctional die further includes an isolation device coupled to the at least one bond pad of the at least one nonfunctional die for electrically isolating the at least one nonfunctional die from the adjacent die interconnection circuit.

* * * * *